(12) United States Patent
Wang et al.

(10) Patent No.: US 11,100,971 B2
(45) Date of Patent: Aug. 24, 2021

(54) FERROELECTRIC DOMAIN REGULATED OPTICAL READOUT MODE MEMORY AND PREPARING METHOD THEREOF

(71) Applicant: Shanghai Institute of Technical Physics of the Chinese Academy of Sciences, Shanghai (CN)

(72) Inventors: Jianlu Wang, Shanghai (CN); Guangjian Wu, Shanghai (CN); Xudong Wang, Shanghai (CN); Hong Shen, Shanghai (CN); Tie Lin, Shanghai (CN); Xiangjian Meng, Shanghai (CN); Junhao Chu, Shanghai (CN)

(73) Assignee: Shanghai Institute of Technical Physics of the Chinese Academy of Sciences

( * ) Notice: Subject to any disclaimer, the term of this patent is extended or adjusted under 35 U.S.C. 154(b) by 0 days.

(21) Appl. No.: 16/823,410

(22) Filed: Mar. 19, 2020

(65) Prior Publication Data
US 2020/0312398 A1   Oct. 1, 2020

(30) Foreign Application Priority Data
Mar. 29, 2019 (CN) .......................... 201910246108.1

(51) Int. Cl.
*G11C 11/22* (2006.01)
*H01L 27/1159* (2017.01)
(Continued)

(52) U.S. Cl.
CPC ........ *G11C 11/2273* (2013.01); *G11C 11/223* (2013.01); *G11C 11/2275* (2013.01);
(Continued)

(58) Field of Classification Search
CPC .............. G11C 11/2273; G11C 11/223; G11C 11/2275; G11C 11/22; H01L 29/2273; H01L 29/516; H01L 27/1159
See application file for complete search history.

(56) References Cited

U.S. PATENT DOCUMENTS

2015/0333196 A1* 11/2015 Shin ................ H01L 31/022408
257/29

* cited by examiner

*Primary Examiner* — Alfredo Bermudez Lozada
(74) *Attorney, Agent, or Firm* — Lerner, David, Littenberg, Krumholz & Mentlik, LLP

(57) ABSTRACT

A ferroelectric domain regulated optical readout mode memory and a preparing method thereof. The memory has such a structure that a two-dimensional semiconductor and a ferroelectric film layer are sequentially arranged on a conductive substrate. The method for preparing the memory includes the steps of preparing the two-dimensional semiconductor on the conductive substrate, preparing a ferroelectric film, then writing a periodic positive-reverse domain structure into the ferroelectric film on the two-dimensional semiconductor by using a piezoresponse force microscopy technology, and regulating a photoluminescent intensity of the two-dimensional semiconductor $WS_2$ by using a ferroelectric domain. A fluorescent picture taken by a fluorescent camera shows light and dark areas corresponding to polarization directions, the light and dark areas represent an on state ('1') and an off state ('0') of the memory respectively, and accordingly the purpose of storage is achieved.

2 Claims, 3 Drawing Sheets

(51) Int. Cl.
*H01L 21/28* (2006.01)
*H01L 29/51* (2006.01)
(52) U.S. Cl.
CPC .... *H01L 27/1159* (2013.01); *H01L 29/40111* (2019.08); *H01L 29/516* (2013.01)

FERROELECTRIC DOMAIN REGULATED OPTICAL READOUT MODE MEMORY AND PREPARING METHOD THEREOF

CROSS REFERENCE TO RELATED APPLICATIONS

This application claims priority from Chinese application number 201910246108.1, filed Mar. 29, 2019, the disclosure of which is hereby incorporated herein by reference.

TECHNICAL FIELD

The present invention relates to the field of memories, and in particular, to a ferroelectric domain regulated optical readout mode memory and a preparing method thereof.

BACKGROUND

A memory is an important part of modern circuits, but due to a quantum effect, the space size of a conventional field effect transistor is already close to its physical limit. Besides, a leakage current becomes increasingly apparent as the size of the transistor is decreased.

A conventional ferroelectric memory utilizes different polarization directions of a ferroelectric material to regulate channel resistance, resulting in two memory states, a high resistance state ('0') and a low resistance state ('1'). Because the photoluminescent intensity of a two-dimensional material is sensitive to the polarization directions of a ferroelectric domain, a method for regulating the luminescent intensity of the two-dimensional material $WS_2$ by using the ferroelectric domain so as to store information is proposed.

When the ferroelectric domain of polyvinylidene fluoride (P(VDF-TrFE)) is polarized downward, the luminescent intensity of the $WS_2$ in contact with the polyvinylidene fluoride is significantly stronger than that of the P(VDF-TrFE) when it is polarized downward, as shown in FIG. 2. Due to the fact that more electrons are injected into the n-type material $WS_2$ during downward polarization, recombination of negative excitons thereof is greatly enhanced. During upward polarization, the electrons in the $WS_2$ are exhausted and the photoluminescent intensity is greatly reduced. After the polarization operations, a fluorescence picture of the $WS_2$ is taken by using a fluorescence camera, and a light area on the fluorescence picture is a position where light emission is strong and represents a storage state '1', and a dark area is an area where light emission is weak and represents a storage state '0'.

SUMMARY

The present invention provides a ferroelectric domain regulated optical readout mode memory and a preparing method thereof, which widen the application of a two-dimensional material in the aspect of electronic devices.

According to the present invention, the luminescent intensity of the two-dimensional material is regulated by utilizing a ferroelectric material, and a storage function is realized by utilizing huge difference between luminescent intensities of the two-dimensional material under different polarization conditions.

The present invention relates to a ferroelectric domain regulated optical readout mode memory, structurally including, sequentially from bottom to top:

a substrate 1,
a two-dimensional semiconductor 2, and
a ferroelectric functional layer 3,
where the substrate 1 is made from heavily doped silicon, the two-dimensional semiconductor 2 is a single-layer two-dimensional material $WS_2$,
the ferroelectric functional layer 3 is a polyvinylidene fluoride based ferroelectric polymer film, and upward and downward polarization of different areas can be realized by utilizing piezoresponse force microscope (PFM) operations.

The present invention relates to a ferroelectric domain regulated optical readout mode memory and a preparing method thereof, where the preparing method includes the following steps:

(1) Preparing a Substrate

The substrate is made from any conductive material.

(2) Preparing and Transferring a Monolayer Two-Dimensional Semiconductor $WS_2$

The monolayer two-dimensional semiconductor $WS_2$ is transferred to the substrate by a mechanical stripping method;

(3) Preparing a Polyvinylidene Fluoride Based Ferroelectric Functional Layer

The polyvinylidene fluoride based ferroelectric functional layer is prepared on the prepared device by applying a spin coating method and annealed for 2 hours at a temperature of 135° C. to ensure crystallization characteristics of the functional layer;

(4) Polarizing the Ferroelectric Functional Layer by Utilizing a Piezoresponse Force Microscope The PFM is a microscope which uses a conductive probe, based on an atomic force microscope (AFM), to detect the electrical deformation of a sample under an applied excitation voltage, the probe of the PFM scans the sample in a contact mode, a voltage generated by a signal generator is applied between the PFM probe and a sample electrode, and the electrical deformation is monitored by using a laser beam reflected by a back surface of a PFM microcantilever. In the present invention, the voltage applied to the sample by a PFM tip is utilized to polarize P(VDF-TrFE). It is found after exploration that for 50 nm P(VDF-TrFE), a scanning voltage and a scanning frequency are respectively controlled to be ±25 V and 1 Hz preferably. In the scanning process, a positive voltage is applied to an area in which '1' needs to be written to make polarization downward; and a negative voltage for scanning is applied to a position where '0' needs to be written to make the polarization upward.

(5) Taking a Fluorescent Picture

A fluorescent camera is used for taking the fluorescent picture of the $WS_2$ after domains are written, and the luminescent intensities of the $WS_2$ under different polarizations are different so that the fluorescent picture can present light and dark areas with periodic changes corresponding to the written domains. Besides, the polarization direction of the ferroelectric domain may be changed by applying a reverse voltage again so as to change a storage state corresponding thereto. FIGS. 3 and 4 show a schematic diagram of a device operating state and a schematic diagram for obtaining a 4×4 memory array diagram. FIG. 3 shows stored information extracted from the picture taken by using the fluorescent camera, and it can be seen that the periodic change thereof is consistent with the ferroelectric domain. FIG. 4 shows the stored information extracted after polarization by applying an opposite voltage in FIG. 3, illustrating that the stored information of each cell may be changed or reversed.

The present invention has the advantages that electric fields generated by utilizing different polarization directions are used for regulating the luminescent intensity of the two-dimensional material, so that the purpose of storage is achieved. Different from a conventional ferroelectric memory which relies on an applied gate voltage to change the polarization direction of a ferroelectric material so as to change channel conductance, the present invention innovatively proposes an "electrical writing and optical readout" storage mechanism. Specifically, voltages in different directions are applied when a tip of the PFM is used for scanning a surface of the sample so that turnover of the ferroelectric domain can be controlled in a nanometer scale. The luminescent intensities of the two-dimensional material $WS_2$ are inconsistent due to ferroelectric polarization electric fields in different directions, and the light-dark alternating storage picture corresponding to a PFM written pattern can be taken by the fluorescent camera. Furthermore, the polarization direction of the ferroelectric domain may be changed by applying the opposite voltage during PFM scanning, that is, the stored information is changed. The extraction of the stored information relies on the fluorescent picture taken by the fluorescent camera at one time, so that the limitation of a reading circuit of the conventional memory is avoided. The memory provided by the present invention has the characteristics of being simple in structure, large in storage density, non-volatile, good in holding characteristic, capable of obtaining all stored information at one time and free of limitation of the conventional readout circuit.

Figure 1:
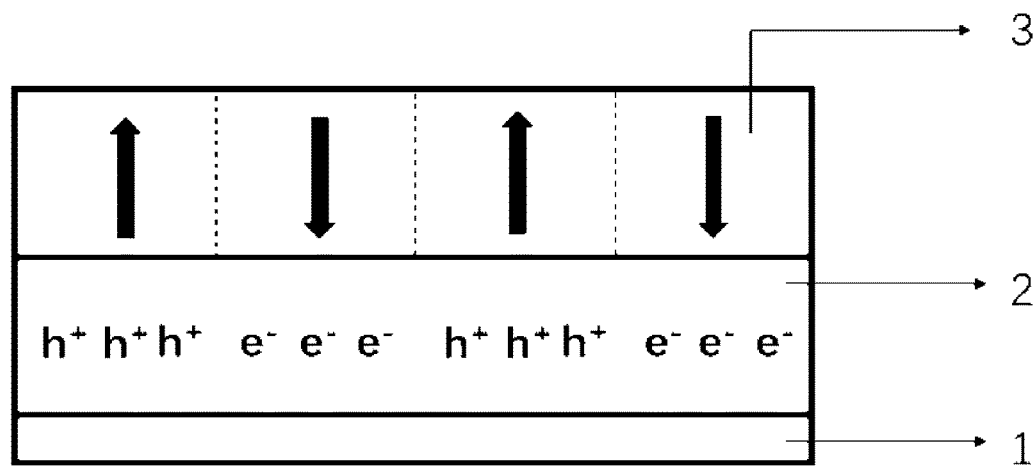
FIG. 1 is a schematic structural cross-sectional view of a ferroelectric domain regulated monolayer $WS_2$ optoelectronic memory.
Figure 2:
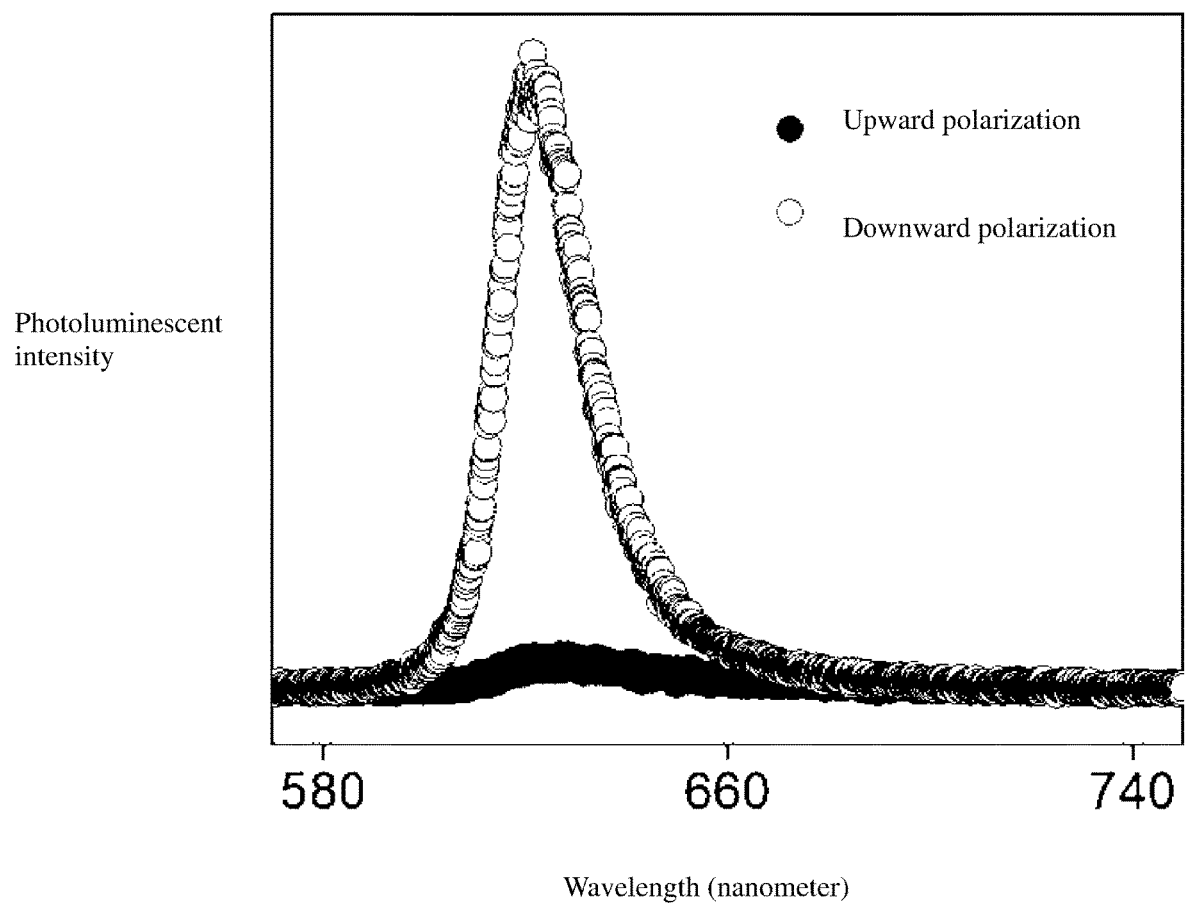
Figure 3:
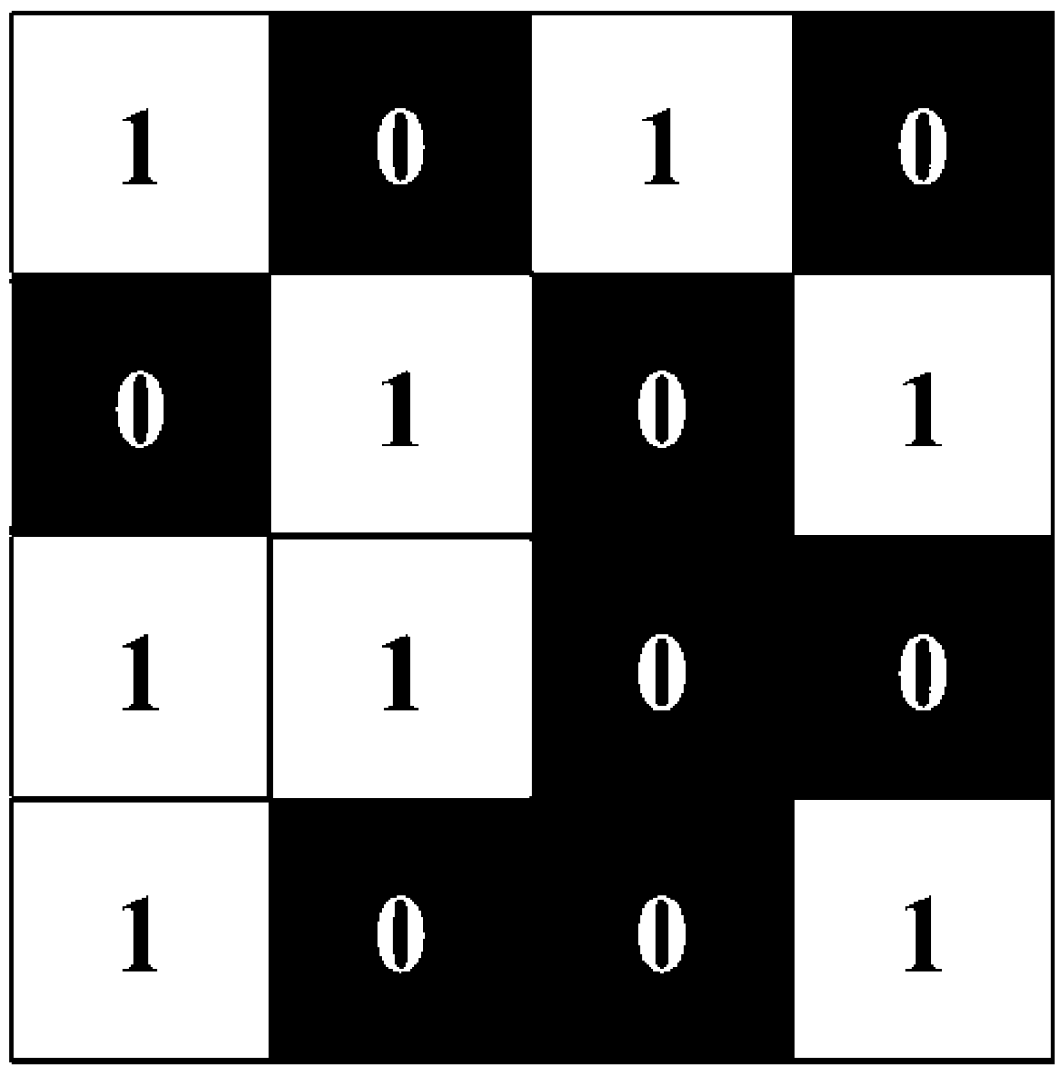
Figure 4:
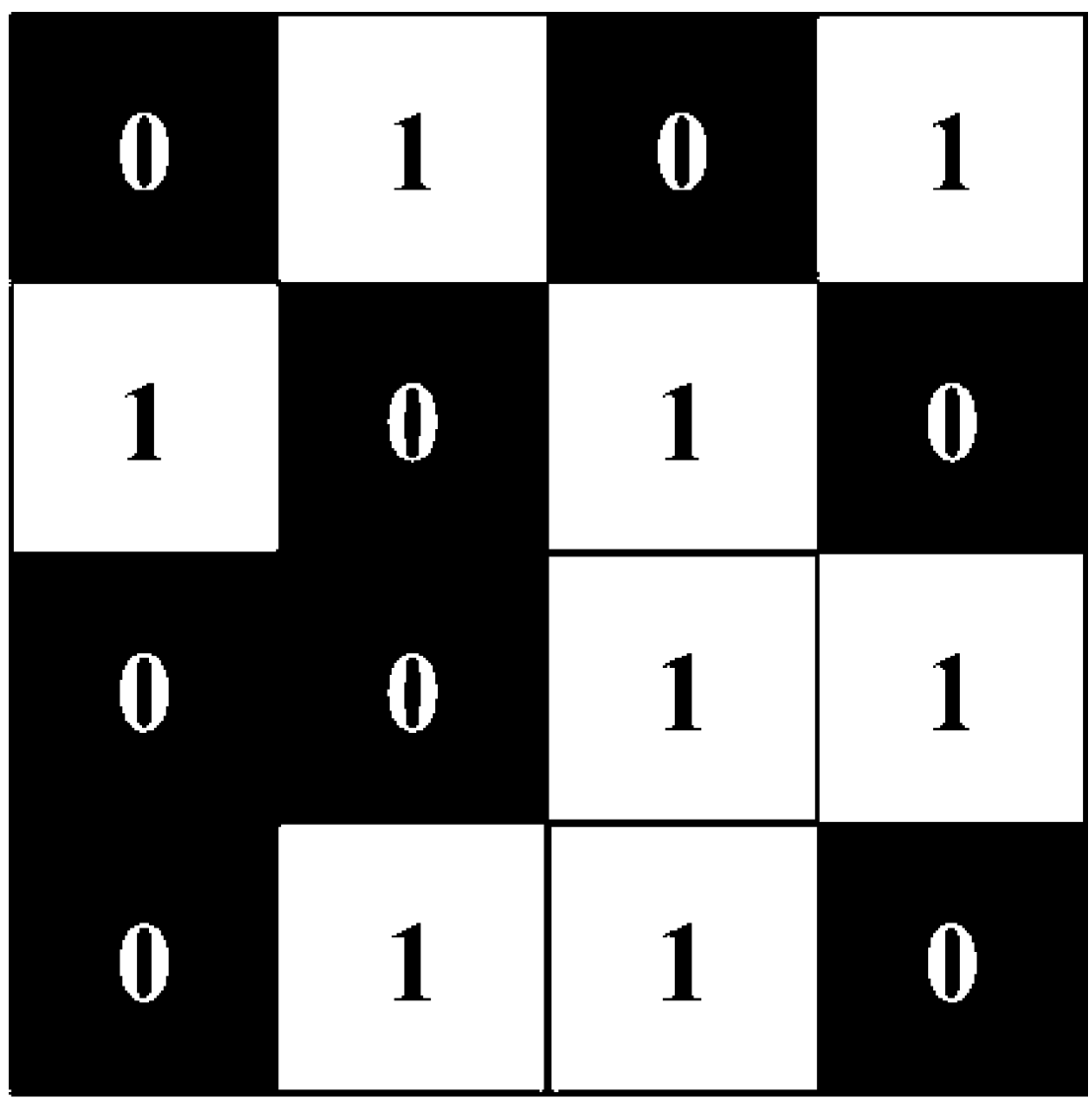

in the figure: 1 substrate made from any conductive material, 2 monolayer $WS_2$, 3 ferroelectric film layer;

FIG. 2 shows $WS_2$ photoluminescent spectra in different polarization directions;

FIG. 3 shows stored information extracted from a fluorescent picture of a PFM operating area.

in the figure: "1" represents an area with strong fluorescence which corresponds to a downward polarization area of a ferroelectric layer; "0" represents an area with weak fluorescence which corresponds to an upward polarization area of the ferroelectric layer; and FIG. 4 shows stored information extracted from a fluorescent picture after the PFM is operated by applying a reverse voltage.

DESCRIPTION OF THE EMBODIMENTS

The following describes a specific implementation mode of the present invention in details with reference to accompanying drawings.

The present invention discloses a ferroelectric domain regulated optical readout mode memory and a preparing method thereof. The luminescent intensity of a two-dimensional material $WS_2$ is changed through different polarization directions of a ferroelectric domain, a photoluminescent picture of the $WS_2$ is taken by a fluorescent camera, and different storage states are represented by different luminescent areas of the $WS_2$, so that a new storage mode of "electric writing and optical readout" is realized.

The method includes the specific steps as follows:
1. Select a substrate.
The substrate is made from any conductive material.
2. Prepare and transfer a two-dimensional semiconductor.

A $WS_2$ crystal is mechanically stripped with an adhesive tape and then transferred to the substrate, and a thickness of the $WS_2$ is the same as that of a single molecular layer.
3. Prepare a ferroelectric functional layer.
The P(VDF-TrFE) ferroelectric functional layer is prepared by applying a spin coating method and annealed at a temperature of 135° C. for 2 hours to ensure its crystalline characteristics.
4. Polarize the ferroelectric functional layer by utilizing a piezoresponse force microscope.

The PFM is a microscope based on an atomic force microscope (AFM) to detect the electric deformation of a sample under an applied excitation voltage by using a conductive probe, the probe of the PFM scans the sample in a contact mode, a voltage generated by a signal generator is applied between the PFM probe and a sample electrode, and the electric deformation of a ferroelectric material is monitored by using a laser beam reflected by the back surface of a PFM microcantilever. The P(VDF-TrFE) is polarized by utilizing a voltage applied to the sample by the PFM tip, and a scanning voltage and a scanning frequency are respectively controlled to be ±25 V and 1 Hz preferably. In the scanning process, a positive voltage is applied to an area in which "1" needs to be written to make polarization downward; and a negative voltage for scanning is applied to a position where "0" needs to be written to make the polarization upward.
5. Take a fluorescent picture and extract stored information.

A fluorescent camera is used for taking the fluorescent picture of the $WS_2$ after domains are written, and the luminescent intensities of the $WS_2$ under different polarizations are different so that the fluorescent picture can present light and dark areas with periodic changes corresponding to the written domains, as shown in FIG. 3. Besides, the polarization direction of the ferroelectric domain may be changed by applying a reverse voltage again so as to change a storage state corresponding thereto, as shown in FIG. 4.

The present invention relates to the ferroelectric domain regulated optical readout mode memory and the preparing method thereof. The memory has the characteristics of being simple in structure, large in storage density, non-volatile, good in holding characteristic, capable of obtaining all stored information at one time and free of limitation of the conventional readout circuit, and accelerates application of a two-dimensional semiconductor material in the field of electronic devices.

What is claimed is:

1. A ferroelectric domain regulated optical readout mode memory, comprising, structurally sequentially from bottom to top, a substrate, a transition metal compound two-dimensional semiconductor and a polyvinylidene fluoride based ferroelectric functional layer, wherein the substrate is made from any conductive material;

the transition metal compound two-dimensional semiconductor is a monolayer transition metal compound tungsten disulfide ($WS_2$); and the polyvinylidene fluoride based ferroelectric functional layer is a polyvinylidene fluoride based ferroelectric polymer film;

wherein the transition metal compound two-dimensional semiconductor is transferred to a surface of the substrate by a mechanical stripping transfer method;

the polyvinylidene fluoride based ferroelectric functional layer is prepared by using a spin coating method, and annealed at a temperature of 135° C. for 2 hours to ensure crystallization characteristics of the polyvinylidene fluoride based ferroelectric functional layer;

a polarization operation is carried out on a storage unit of the polyvinylidene fluoride based ferroelectric functional layer by using a piezo-response force microscope; and a fluorescent picture of the tungsten disulfide ($WS_2$) is taken by using a fluorescent camera to obtain stored information.

2. A method for preparing a ferroelectric domain regulated optical readout mode memory, wherein, the ferroelectric domain regulated optical readout mode memory comprises, structurally sequentially from bottom to top, a substrate, a transition metal compound two-dimensional semiconductor and a polyvinylidene fluoride based ferroelectric functional layer, wherein the substrate is made from any conductive material; the transition metal compound two-dimensional semiconductor is a monolayer transition metal compound tungsten disulfide ($WS_2$); and the polyvinylidene fluoride based ferroelectric functional layer is a polyvinylidene fluoride based ferroelectric polymer film, and the method comprises:

transferring the transition metal compound two-dimensional semiconductor to a surface of the substrate by a mechanical stripping transfer method;

preparing the polyvinylidene fluoride based ferroelectric functional layer by using a spin coating method, and annealing at a temperature of 135° C. for 2 hours to ensure crystallization characteristics of the polyvinylidene fluoride based ferroelectric functional layer;

carrying out a polarization operation on a storage unit of the polyvinylidene fluoride based ferroelectric functional layer by using a piezo-response force microscope; and taking a fluorescent picture of the tungsten disulfide ($WS_2$) by using a fluorescent camera to obtain stored information.

* * * * *